（12） United States Patent
Yu

(10) Patent No.: US 11,714,510 B2
(45) Date of Patent: Aug. 1, 2023

(54) CAPACITANCE DETECTION CIRCUIT, TOUCH CONTROL CHIP AND ELECTRONIC DEVICE

(71) Applicant: SHENZHEN GOODIX TECHNOLOGY CO., LTD., Guangdong (CN)

(72) Inventor: Qian Yu, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 190 days.

(21) Appl. No.: 17/477,993

(22) Filed: Sep. 17, 2021

(65) Prior Publication Data
US 2022/0004273 A1 Jan. 6, 2022

Related U.S. Application Data

(63) Continuation of application No. PCT/CN2020/093850, filed on Jun. 2, 2020.

(51) Int. Cl.
*G06F 3/044* (2006.01)
*G01R 27/26* (2006.01)

(52) U.S. Cl.
CPC .......... *G06F 3/044* (2013.01); *G01R 27/2605* (2013.01)

(58) Field of Classification Search
CPC ........ G06F 3/041; G06F 3/044; G06F 3/0444; G01R 27/2605
See application file for complete search history.

(56) References Cited

U.S. PATENT DOCUMENTS

2012/0154048 A1* 6/2012 Myles ................ H03F 3/45704
330/260
2015/0338958 A1 11/2015 Decaro et al.
(Continued)

FOREIGN PATENT DOCUMENTS

| CN | 108064344 A | 5/2018 |
| CN | 108124474 A | 6/2018 |
| CN | 108475155 A | 8/2018 |

OTHER PUBLICATIONS

Miyamoto et al., "A 143 × 81 Mutual-Capacitance Touch-Sensing Analog Front-End With Parallel Drive and Differential Sensing Architecture", IEEE Journal of Solid-State Circuits (2015), vol. 50, No. 1, pp. 335-343.

(Continued)

*Primary Examiner* — Ricardo Osorio
(74) *Attorney, Agent, or Firm* — Scully, Scott, Murphy & Presser, P.C.

(57) ABSTRACT

A capacitance detection circuit, a touch control chip and an electronic device can effectively extract a capacitance change without increasing costs of a circuit. The capacitance detection circuit includes: a CCA circuit, a first input end and a second input end of the CCA circuit are connected to a capacitance to be measured and a cancellation capacitance, respectively, a third input end of the CCA circuit is connected to a coding voltage, and a first output end and a second output end of the CCA circuit output a first current and a second current, respectively, where the cancellation capacitance is smaller than an initial value of the capacitance to be measured; a PGA circuit, two input ends of the PGA circuit are connected to two output ends of the CCA circuit, respectively.

17 Claims, 3 Drawing Sheets

(56) References Cited

U.S. PATENT DOCUMENTS

| | | |
|---|---|---|
| 2016/0034094 A1 | 2/2016 | Kang et al. |
| 2017/0322674 A1* | 11/2017 | Rosenberg .......... G06F 3/04166 |
| 2018/0209858 A1 | 7/2018 | Feng et al. |
| 2019/0196654 A1 | 6/2019 | Jiang et al. |
| 2019/0302928 A1 | 10/2019 | Yuan et al. |
| 2020/0220544 A1* | 7/2020 | Chen .................... H03K 17/962 |
| 2020/0300934 A1* | 9/2020 | Gray .................. G01R 33/0023 |

OTHER PUBLICATIONS

Jiang, H. et al., "A 117-dB In-Band CMRR 98.5-dB SNR Capacitance-to-Digital Converter for Sub-nm Displacement Sensing With an Electrically Floating Target," IEEE Solid-State Circuits Letters (2019), vol. 3, pp. 9-12.

\* cited by examiner

CAPACITANCE DETECTION CIRCUIT, TOUCH CONTROL CHIP AND ELECTRONIC DEVICE

CROSS-REFERENCE TO RELATED APPLICATIONS

This application is a continuation of International Application No. PCT/CN2020/093850, filed on Jun. 2, 2020, the disclosure of which is hereby incorporated by reference in its entirety.

TECHNICAL FIELD

Embodiments of the present application relate to the field of capacitance detection, and in particular, to a capacitance detection circuit, a touch control chip and an electronic device.

BACKGROUND

Capacitive sensors are widely used in electronic products to achieve touch detection. A capacitance value may change with touch of a user's finger in a capacitive sensor. The change of a capacitance can be read by a capacitance detection circuit, thereby judging a user's operation based on the change of the capacitance, and achieving a better human-computer interaction experience. As a size of a touch screen increases and a screen body technology is updated, the capacitance value of the touch screen is also increasing. How to effectively extract a tiny capacitance change without increasing costs of the capacitance detection circuit has become an urgent problem to be solved.

SUMMARY

Embodiments of the present application provide a capacitance detection circuit, a touch control chip and an electronic device, which can effectively extract a tiny capacitance change without increasing costs of the capacitance detection circuit.

According to a first aspect, a capacitance detection circuit is provided, including:

a CCA circuit, a first input end and a second input end of the CCA circuit are connected to a capacitance to be measured and a cancellation capacitance, respectively, a third input end of the CCA circuit is connected to a coding voltage, and a first output end and a second output end of the CCA circuit output a first current and a second current, respectively, where the cancellation capacitance is smaller than an initial value of the capacitance to be measured;

a PGA circuit, two input ends of the PGA circuit are connected to the first output end and the second output end of the CCA circuit, respectively;

where a ratio between the first current and the second current is set to be equal to a ratio between the initial value of the capacitance to be measured and the cancellation capacitance, so that when the capacitance to be measured is the initial value, an output of the PGA circuit is 0, and when the capacitance to be measured changes relative to the initial value, the output of the PGA circuit is associated with a capacitance change of the capacitance to be measured.

In a possible implementation manner, an output stage of the CCA circuit includes a first circuit unit and a second circuit unit, the first circuit unit includes a first P-channel Metal Oxide Semiconductor (PMOS) transistor and a first N-channel Metal Oxide Semiconductor (NMOS) transistor, and a drain of the first PMOS transistor, a drain of the first NMOS transistor and the first output end of the CCA circuit are connected; the second circuit unit includes a second PMOS transistor and a second NMOS transistor, and a drain of the second PMOS transistor, a drain of the second NMOS transistor and the second output end of the CCA circuit are connected; and a gate voltage of the first PMOS transistor is the same as a gate voltage of the second PMOS transistor, and a gate voltage of the first NMOS transistor is the same as a gate voltage of the second NMOS transistor.

In a possible implementation manner, a ratio between the first current and the second current is obtained by setting a ratio between a width/length of the first PMOS transistor and the first NMOS transistor and a width/length of the second PMOS transistor and the second NMOS transistor.

In a possible implementation manner, a ratio between the first current and the second current is obtained by setting a ratio between the number of the first circuit unit and the number of the second circuit unit included in the CCA circuit.

In a possible implementation manner, a ratio between the first current and the second current output by the CCA circuit is adjustable, and the cancellation capacitance is an adjustable capacitance, where the output of the PGA circuit is 0 when the capacitance to be measured is the initial value by adjusting the ratio between the first current and the second current and/or the cancellation capacitance.

In a possible implementation manner, the ratio between the first current and the second current is between 5:1 and 10:1.

In a possible implementation manner, the PGA circuit includes a differential amplifier, and a feedback capacitance and a feedback resistance connected cross an input end and an output end of the differential amplifier.

In a possible implementation, the coding voltage is a square wave signal or a sinusoidal signal.

In a second aspect, a touch control chip is provided, including the capacitance detection circuit in the first aspect or any one of the possible implementation manners of the first aspect.

In a third aspect, an electronic device is provided, including:

a touch screen; and the touch control chip in the second aspect or any one of the possible implementation manners of the second aspect.

Based on the above technical solution, the capacitance detection circuit is provided with the CCA circuit and the PGA circuit connected to the CCA circuit. The input ends of the CCA circuit are connected with the capacitance to be measured and the cancellation capacitance, respectively, and the output ends of the CCA circuit output the corresponding first current and second current, respectively. The cancellation capacitance is smaller than the initial value of the capacitance to be measured, and the ratio between the first current and the second current is set to be equal to the ratio between the initial value of the capacitance to be measured and the cancellation capacitance. Therefore, when the capacitance to be measured is the initial value, the output of the PGA circuit is 0, and when the capacitance to be measured changes relative to the initial value, the output of the PGA circuit is associated with the capacitance change of the capacitance to be measured. Therefore, the capacitance change of the capacitance to be measured can be obtained through a signal output by the PGA circuit, and a smaller cancellation capacitance can be used to cancel an initial value of a larger capacitance to be measured, which can also reduce the costs of the capacitance detection circuit.

DESCRIPTION OF EMBODIMENTS

The following describes technical solutions of the present application with reference to accompanying drawings.

For a capacitive sensor, the larger a capacitance value of a touch screen itself, the more difficult it is to extract a tiny capacitance change caused by touch. In order to increase a sensitivity of detection of the capacitance change, a voltage input to the touch screen is often selected to be larger. When detecting the capacitance change, a detected capacitance value of the touch screen also becomes larger. In this case, a capacitance detection circuit is easily saturated. In order to prevent saturation of the capacitance detection circuit, a higher dynamic range of the circuit is required, which may cause a power consumption of the capacitance detection circuit to increase exponentially.

Moreover, a large part of data read by the capacitance detection circuit is a large capacitance of the touch screen itself, and this part of the data is redundant data that does not carry effective information for the capacitance change caused by the touch. In order to achieve a capacitance detection circuit with a lower power consumption and a higher signal-to-noise ratio, as well as to improve efficiency of storing the effective information, some methods can be used to circumvent a requirement for the large dynamic range.

Figure 1:
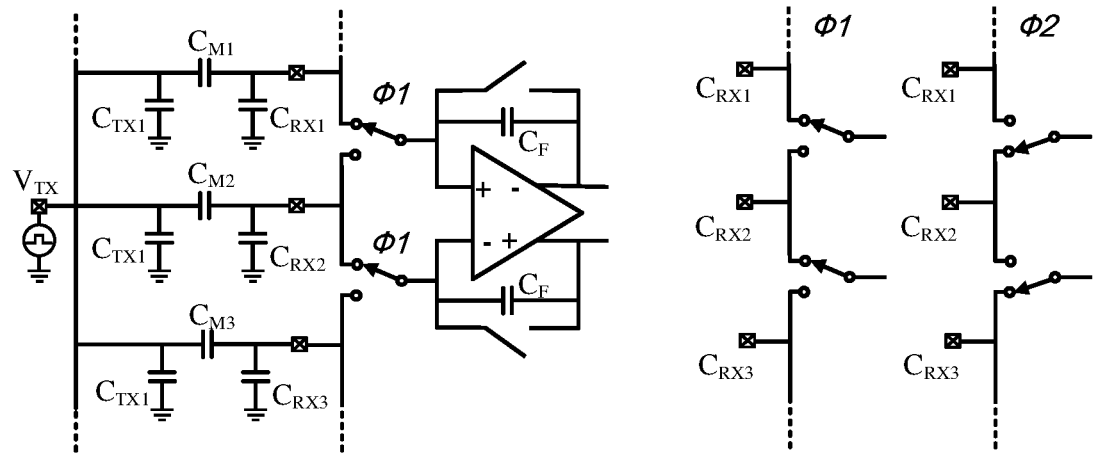
FIG. 1 is a capacitance detection circuit based on a full differential.

One method is that a front end of the circuit performs a full differential on data of adjacent read channels. In this way, adjacent touch screen capacitances are respectively connected to positive and negative ends of the differential, and a differential operational amplifier is used to amplify a current or a charge of a differential mode at both ends, thereby suppressing common mode signal, interference and noise. Interference signals received by adjacent channels are basically the same, and the capacitance of the touch screen itself on the adjacent channels is also similar, an interference signal and a capacitance signal of the touch screen itself may be effectively suppressed as a common mode, and a requirement of the dynamic range of the capacitance detection circuit is also greatly reduced. However, this differential circuit requires simultaneous reading of data from the adjacent channels, it is often necessary to perform two differentials at different time to obtain differences between all the adjacent channels, save them and restore the capacitance change of all the channels. For example, as shown in FIG. 1, it is assumed that the differential operational amplifier performs differentials on three detection channels, it needs to perform two differentials at different time to obtain the capacitance change corresponding to all detection channels. It can be seen that read data at different time may lose a refresh rate of reading a touch screen signal so it is difficult to accept in an electronic device with a high refresh rate, and use of differential data in a positioning algorithm of touch detection also needs to be verified.

Figure 2:
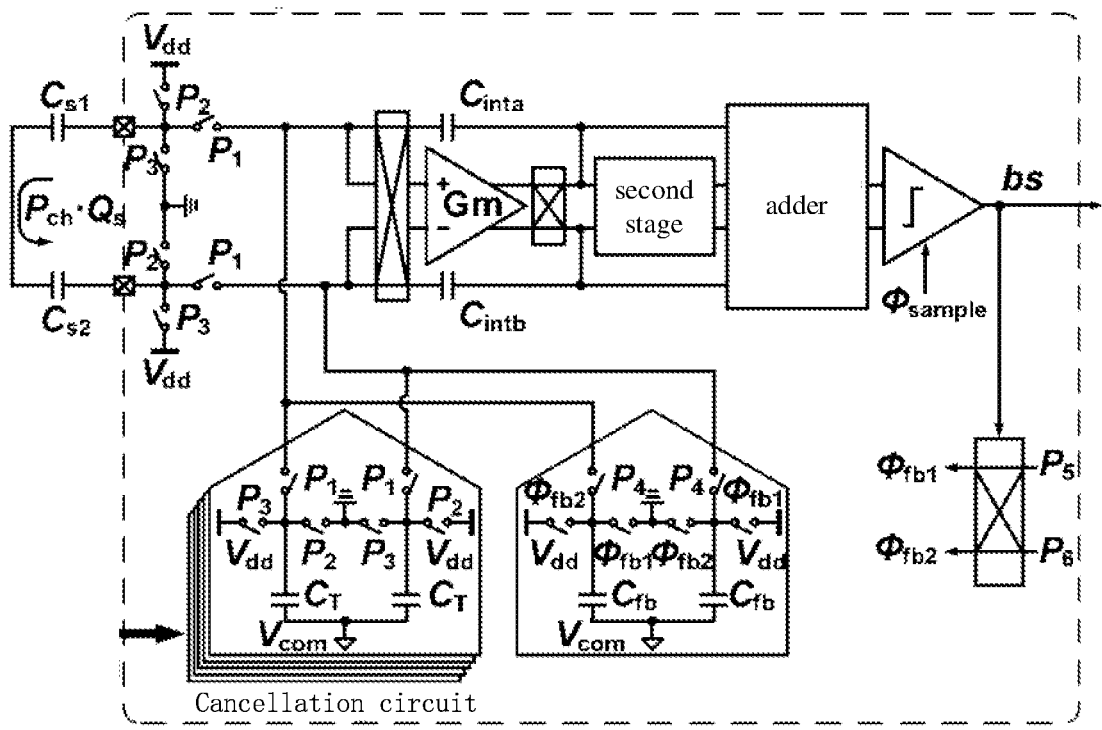
FIG. 2 is a capacitance detection circuit based on a cancellation capacitance.

Another method is that the large capacitance of the touch screen itself is cancelled. In this solution, before the capacitance detection circuit reads the capacitance value, a cancellation circuit may cancel the capacitance of the touch screen itself, and subtracts the capacitance of the touch screen itself in voltage, charge, or current domain. After subtracting the large capacitance of the touch screen, the tiny capacitance change caused by the touch can be read out as an effective signal. For example, as shown in FIG. 2, when a capacitance to be measured $C_{S1}$ is connected to a coding voltage $V_{dd}$, a capacitance $C_T$ used to cancel the charge is grounded, and the charge on the capacitance to be measured $C_{S1}$ and the capacitance $C_T$ are $C_{S1} \times V_{dd}$ and 0, respectively. When canceling the charge, the capacitance to be measured $C_{S1}$ is connected to an upper plate of the capacitance $C_T$, and a total charge is $C_{S1} \times V_{dd} = (C_{S1} + C_T) \times V_{CM}$, where $V_{CM}$ is a common mode voltage of an input end of a front-end circuit Gm, that is, ½ $V_{dd}$. Then, the capacitance $C_T$ needs to be equal to $C_{S1}$, so that the cancelled voltage can be the common mode voltage of the front-end circuit. As the capacitance of the touch screen itself becomes larger and larger, the capacitance $C_T$ required for cancellation also increases, and an area of a chip in which the capacitance detection circuit is located increases accordingly, resulting in high costs of the chip.

To this end, the present application provide a capacitance detection circuit that can use a smaller cancellation capacitance to cancel a larger touch screen capacitance, which can effectively extract a tiny capacitance change without increasing costs of a capacitance detection circuit.

Figure 3:
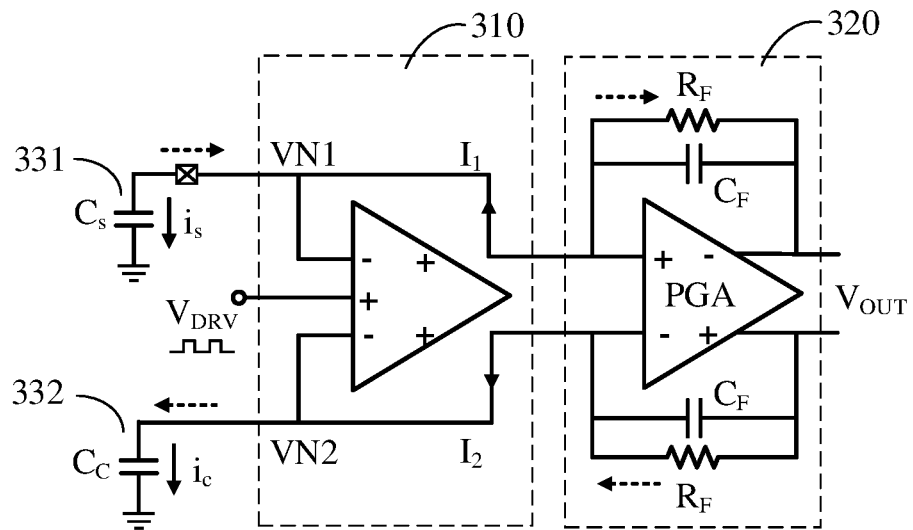
FIG. 3 is a schematic diagram of a capacitance detection circuit according to an embodiment of the present application.

FIG. 3 is a possible circuit structure of a capacitance detection circuit according to an embodiment of the present application. As shown in FIG. 3, a capacitance detection circuit 300 includes a common mode control amplifier (CCA) circuit 310 and a programmable gain amplifier (Programmable Gain Amplifier, PGA) circuit 320.

Specifically, a first input end and a second input end of the CCA circuit 310 are connected to a capacitance to be measured 331 and a cancellation capacitance 332, respectively, a third input end of the CCA circuit 310 is connected to the coding voltage, and a first output end and a second output end of the CCA circuit 310 output a first current I1 and a second current I2, respectively.

For example, the coding voltage may be a square wave signal or a sinusoidal signal.

Specifically, two input ends of the PGA circuit 320 are connected to the first output end and the second output end of the CCA circuit 310, respectively.

The cancellation capacitance 332 is smaller than an initial value of the capacitance to be measured 332.

A ratio between the first current I1 and the second current I2 is set to be equal to a ratio between the initial value of the capacitance to be measured 331 and the cancellation capacitance 332, so that when the capacitance to be measured is the initial value, an output of the PGA circuit 320 is 0, and when the capacitance to be measured changes relative to the initial value, the output of the PGA circuit 320 is associated with a capacitance change of the capacitance to be measured.

It should be understood that in a practical application, the output of the PGA circuit 320 is 0 which described in embodiments of the present application can refer that a signal value output by the PGA circuit 320 is 0; or refer that the signal value output by the PGA circuit 320 is within an allowable range, which can be considered that the output is basically 0.

In this embodiment, the ratio between the first current I1 and the second current I2 output by the CCA circuit 310 is set to be equal to the ratio between the initial value of the capacitance to be measured 311 and the cancellation capacitance 332. On the one hand, the cancellation capacitance 332 can be made smaller than the initial value of the capacitance to be measured 331 by setting the ratio between the first current I1 and the second current I2; on the other hand, the ratio between the first current I1 and the second current I2 is equal to the ratio between the initial value of the capacitance to be measured 331 and the cancellation capacitance 332, so that when the capacitance to be measured 331 is the initial value, the output of the PGA circuit 320 is 0, and when the capacitance to be measured 331 changes relative to the initial value, the output of the PGA circuit 320 is associated with the capacitance change of the capacitance to be measured 331. To this end, the capacitance change of the capacitance to be measured 331 can be obtained according to a signal output by the PGA circuit 320, and a smaller cancellation capacitance 332 can be used to cancel a larger initial value of the capacitance to be measured 331, which also reduces the costs of the capacitance detection circuit.

When the capacitance detection circuit 300 is applied in the field of touch, for example, in a touch screen of a mutual-capacitance detection, the initial value of the capacitance to be measured 331 can be, for example, a capacitance value between a horizontal electrode and a vertical electrode of the touch screen when a finger is not touching the touch screen. And the capacitance change of the capacitance to be measured 331 can be, for example, a mutual-capacitance value between the horizontal electrode and vertical electrode of the touch screen relative to the capacitance change of the initial value when the finger is touching the touch screen, and the capacitance change is introduced by finger touch.

A working principle of the CCA circuit 310 is described in detail below in combination with FIG. 3.

As shown in FIG. 3, two input ends of the CCA circuit 310 are connected to the capacitance to be measure 331 and the cancellation 332, respectively. Two output ends of the CCA circuit 310 can output common mode currents I1 and I2, so that the voltage on the capacitance to be measured 331 and the cancellation capacitance 332 is equal to a common mode voltage. When another input end of the CCA circuit 310 is connected to a coding voltage $V_{DRV}$, if a capacitance value $C_C$ of the cancellation capacitance 332 is equal to a capacitance value $C_S$ of the capacitance to be measured 331, that is, $C_C = C_S$, then a common mode current on the capacitance to be measured 331 is $i_S = sC_S \times V_{DRV}$, and a common mode current on the cancellation capacitance 332 is $i_C = sC_C \times V_{DRV}$. The current $i_S$ and $i_C$ may be flown out or in through the CCA circuit 310. The PGA circuit 320 of a later stage cannot see the common mode current, so that the output of the PGA circuit 320 is close to 0, where $C_S$ is an initial value of the capacitance to be measured 331, or a base value, for example, it can be the capacitance of the touch screen itself. When the capacitance value of the capacitance to be measured 331 changes based on the initial value $C_S$, such as from $C_S$ to $C_S + \Delta C$, a differential mode current can be generated, which may be input to the PGA circuit 320, and a voltage change of a differential output end of the PGA circuit 320 reflects a capacitance change $\Delta C$ of the capacitance to be measured 331. The capacitance change $\Delta C$ of the capacitance to be measured 331 can be obtained through a voltage signal $V_{OUT}$ output by the PGA circuit 320.

Furthermore, when a current ratio of the current I1 and the current I2 is set to M:N, a ratio between the initial value $C_S$ of the capacitance to be measured 331 and the capacitance value $C_C$ of the cancellation capacitance 332 can be M:N. When N<M, the large capacitance $C_S$ of the touch screen itself can be cancelled with N/M times of the cancellation capacitance 332, that is, $C_C = (N/M) \times C_S$ is used to cancel $C_S$. It is assumed that M=10N, only ⅒ of the $C_S$ needs to be inside the chip, which implements use of a small area and low-cost chip to cancel a large capacitance load of the touch screen.

Figure 4:
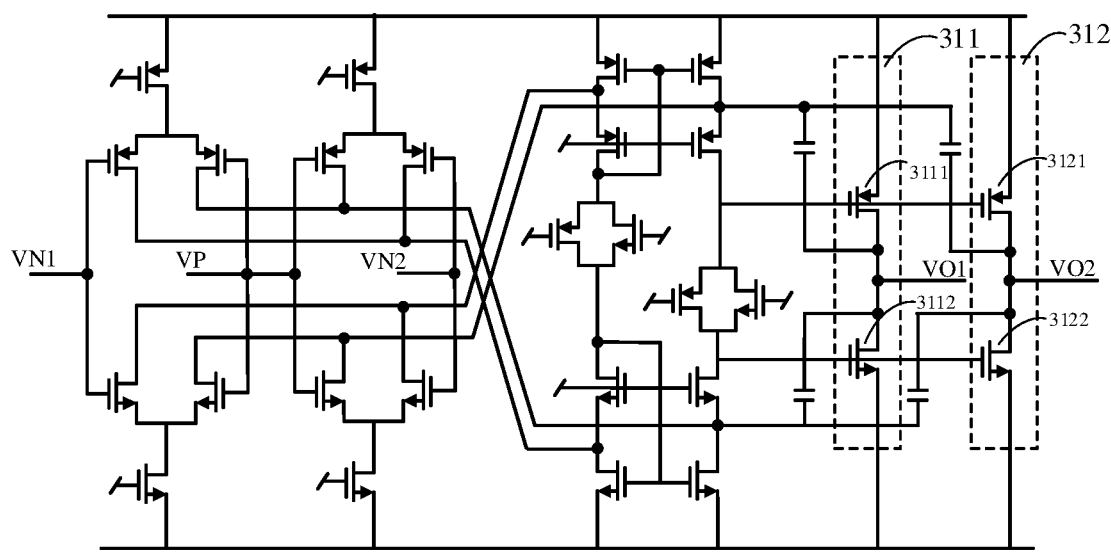
FIG. 4 is a schematic diagram of a possible circuit structure of a CCA circuit according to an embodiment of the present application.

The embodiments of the present application does not limit a specific structure of the CCA circuit 310, and other common mode control circuits that can implement the above functions are applicable to the present application. FIG. 4 is a possible circuit structure of a CCA circuit 310. VN1 and VN2 in FIG. 4 are voltages corresponding to the first input end and the second input end of the CCA circuit 310 in FIG. 3; VP is a voltage corresponding to the third input end, that is, $V_{DRV}$ in FIG. 3; VO1 and VO2 are voltages corresponding to the two output ends of the CCA circuit 310 in FIG. 3, respectively, and the corresponding currents are the above I1 and I2, respectively.

As shown in FIG. 4, an output stage of the CCA circuit 310 includes a first circuit unit 311 and a second circuit 312. Specifically, the first circuit unit 311 includes a first PMOS transistor 3111 and a first NMOS transistor 3112, and a drain of the first PMOS transistor 3111, a drain of the first NMOS transistor 3112 and the first output end (VO1) of the CCA circuit 310 are connected. The second circuit unit 312 includes a second PMOS transistor 3121 and a second NMOS transistor 3122, and a drain of the second PMOS transistor 3121, a drain of the second NMOS transistor 3122 and the second output end (VO2) of the CCA circuit (310) are connected. Specifically, a gate voltage of the first PMOS transistor 3111 is the same as a gate voltage of the second PMOS transistor 3121, and a gate voltage of the first NMOS transistor 3112 is the same as a gate voltage of the second NMOS transistor 3122.

A first transistor circuit 311 is used to output the first current I1, and a second transistor circuit 312 is used to output the second current I2. The magnitude of the first current I1 and the second current I2 output by the CCA circuit 310 can be controlled by configuring the first circuit unit 311 and the second circuit unit 312 of the output stage of the CCA circuit 310, such as configuring a width/length (W/L) of a MOS transistor in the first circuit unit 311 and the second circuit unit 312, or configuring the number of the first circuit unit 311 and the second circuit unit 312, and so on.

For example, a ratio between the first current I1 and the second current I2 is obtained by setting a ratio between a width/length of the first PMOS transistor 3111 and the first NMOS transistor 3112 in the first circuit unit 331 and a width/length of the second PMOS transistor 3121 and the second NMOS transistor 3122 in the second circuit unit 312.

It is assumed that the width/length of the first PMOS transistor 3111 and the first NMOS transistor 3112 is M:1, and the width/length of the second PMOS transistor 3121 and the second NMOS transistor 3122 is N:1, then a ratio between the first current I1 and the second current I2 is I1:I2=M:N.

For another example, a ratio between the first current I1 and the second current I2 is obtained by setting a ratio between the number of the first circuit unit 311 and the number of the second circuit unit 312 included in the CCA circuit 310.

Figure 5:
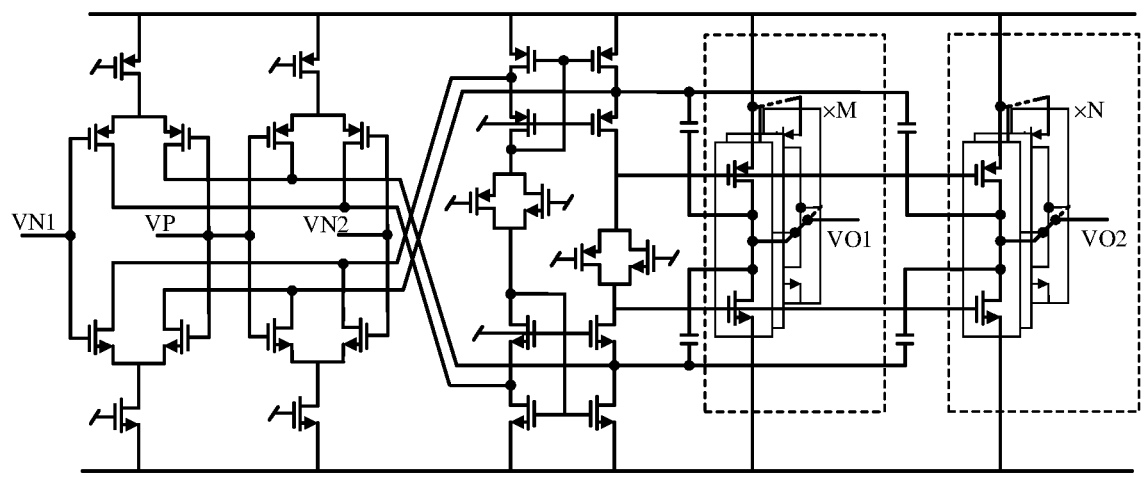
FIG. 5 is a schematic diagram of a possible circuit structure of a CCA circuit according to an embodiment of the present application.

For example, as shown in FIG. 5, it is assumed that the output stage of the CCA circuit 310 includes M first circuit unit 311 connected in parallel and N second circuit units 312 connected in parallel, then a ratio between the first current I1 and the second current I2 output by the first circuit unit 311 and the second circuit 312 respectively is I1:I2=M:N.

The ratio between the first current I1 and the second current I2 can be set according to characteristics of the touch screen and requirements for the cancellation capacitance. For example, I1:I2 can be between 5:1 and 15:1, such as I1:I2=10:1. Accordingly, the capacitance value $C_C$ of the cancellation capacitance 332 may be 1/5 to 1/15, such as 1/10, of the initial value $C_S$ of the capacitance to be measured 331.

In the embodiments of the present application, the ratio between the first current I1 and the second current I2 output by the CCA circuit 310 can be adjustable. The cancellation capacitance 332 may also be an adjustable capacitance. Specifically, by adjusting the ratio I1:I2 between the first current I1 and the second current I2, and/or adjusting the capacitance value $C_C$ of the cancellation capacitance 332, the voltage $V_{OUT}$ output by the PGA circuit 320 can be 0 when the capacitance value of the capacitance to be measured 331 is equal to the initial value $C_S$.

A plurality of gears can be set at the output stage of the CCA circuit 310. For example, the plurality of gears are set for the first circuit unit 311 and the second circuit units 312, respectively, where MOS transistors corresponding to different gears have different width/length; for another example, as shown in FIG. 5, the number of the first circuit unit 311 and the second circuit unit 312 that currently need to be connected in parallel are selected by a gear switch, for example, when selecting M first circuit units 311 and N second circuit units 312, I1:I2=M:N. Therefore, initially, by adjusting the gear of the CCA circuit 310, and/or adjusting the capacitance value of the cancellation capacitance 332, the voltage signal $V_{OUT}$ output by the PGA circuit 320 is basically 0. Then, during capacitance detection, if a finger touches, the capacitance change of the capacitance to be measured 311 caused by the touch can be known according to the change of the voltage signal $V_{OUT}$ output by the PGA circuit 320.

As shown in FIG. 3, for example, the PGA circuit 320 includes a differential amplifier PGA, and feedback capacitances $C_F$ and feedback resistances $R_F$ connected cross the input end and the output end of the differential amplifier PGA.

The embodiments of the present application further provide a touch control chip, including the capacitance detection circuit in the foregoing various embodiments of the present application.

The embodiments of the present application further provides an electronic device, and the electronic device includes: a touch screen; and the touch control chip in the foregoing various embodiments of the present application.

By way of example and not limitation, the electronic device in the embodiments of the present application can be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable smart device includes a device such as a smart watch or smart glasses, that is of a full-featured and a large-sized and that can implement all or some functions without relying on a smart phone, and a device such as a smart bracelet or a smart jewelry for physical sign monitoring, that only focuses on a certain type of application function and shall be used in cooperation with other device such as a smart phone.

It should be noted that, in a case of no conflict, the various embodiments and/or the technical features in the various embodiments described in the present application may be combined with each other arbitrarily, and the technical solutions obtained after the combination should also fall within the protection scope of the present application.

It should be noted that specific examples in embodiments of the present application are just for helping those skilled in the art better understand the embodiments of the present application, rather than for limiting the scope of the embodiments of the present application. Those skilled in the art can make various improvements and variations on the basis of the above embodiments, and such improvements or variations are all within the protection scope of the present application.

The foregoing descriptions are merely specific embodiments of the present application, but the protection scope of the present application is not limited thereto, those skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detection circuit, comprising:
   a common mode control amplifier (CCA) circuit, a first input end and a second input end of the CCA circuit are connected to a capacitance to be measured and a cancellation capacitance, respectively, a third input end of the CCA circuit is connected to a coding voltage, and a first output end and a second output end of the CCA circuit output a first current and a second current, respectively, wherein the cancellation capacitance is smaller than an initial value of the capacitance to be measured;
   a programmable gain amplifier (PGA) circuit, two input ends of the PGA circuit are connected to the first output end and the second output end of the CCA circuit, respectively;
   wherein a ratio between the first current and the second current is set to be equal to a ratio between the initial value of the capacitance to be measured and the cancellation capacitance, so that when the capacitance to be measured is the initial value, an output of the PGA circuit is 0, and when the capacitance to be measured changes relative to the initial value, the output of the PGA circuit is associated with a capacitance change of the capacitance to be measured.

2. The capacitance detection circuit according to claim 1, wherein an output stage of the CCA circuit comprises a first circuit unit and a second circuit unit,
   the first circuit unit comprises a first PMOS transistor and a first NMOS transistor, and a drain of the first PMOS transistor, a drain of the first NMOS transistor and the first output end of the CCA circuit are connected;
   the second circuit unit comprises a second PMOS transistor and a second NMOS transistor, and a drain of the second PMOS transistor, a drain of the second NMOS transistor and the second output end of the CCA circuit are connected; and
   a gate voltage of the first PMOS transistor is the same as a gate voltage of the second PMOS transistor, and a gate voltage of the first NMOS transistor is the same as a gate voltage of the second NMOS transistor.

3. The capacitance detection circuit according to claim 2, wherein a ratio between the first current and the second current is obtained by setting a ratio between a width/length of the first PMOS transistor and the first NMOS transistor and a width/length of the second PMOS transistor and the second NMOS transistor.

4. The capacitance detection circuit according to claim 2, wherein a ratio between the first current and the second current is obtained by setting a ratio between the number of the first circuit unit and the number of the second circuit unit included in the CCA circuit.

5. The capacitance detection circuit according to claim 1, a ratio between the first current and the second current output by the CCA circuit is adjustable, and the cancellation capacitance is an adjustable capacitance, wherein the output of the PGA circuit is 0 when the capacitance to be measured is the initial value by adjusting the ratio between the first current and the second current and/or the cancellation capacitance.

6. The capacitance detection circuit according to claim 1, wherein the ratio between the first current and the second current is between 5:1 and 10:1.

7. The capacitance detection circuit according to claim 1, wherein the PGA circuit comprises a differential amplifier, and a feedback capacitance and a feedback resistance connected cross an input end and an output end of the differential amplifier.

8. The capacitance detection circuit according to claim 1, wherein the coding voltage is a square wave signal or a sinusoidal signal.

9. A touch control chip, comprising a capacitance detection circuit, wherein the capacitance detection circuit comprises:
a common mode control amplifier (CCA) circuit, a first input end and a second input end of the CCA circuit are connected to a capacitance to be measured and a cancellation capacitance, respectively, a third input end of the CCA circuit is connected to a coding voltage, and a first output end and a second output end of the CCA circuit output a first current and a second current, respectively, wherein the cancellation capacitance is smaller than an initial value of the capacitance to be measured;
a programmable gain amplifier (PGA) circuit, two input ends of the PGA circuit are connected to the first output end and the second output end of the CCA circuit, respectively;
wherein a ratio between the first current and the second current is set to be equal to a ratio between the initial value of the capacitance to be measured and the cancellation capacitance, so that when the capacitance to be measured is the initial value, an output of the PGA circuit is 0, and when the capacitance to be measured changes relative to the initial value, the output of the PGA circuit is associated with a capacitance change of the capacitance to be measured.

10. The touch control chip according to claim 9, wherein an output stage of the CCA circuit comprises a first circuit unit and a second circuit unit,
the first circuit unit comprises a first PMOS transistor and a first NMOS transistor, and a drain of the first PMOS transistor, a drain of the first NMOS transistor and the first output end of the CCA circuit are connected;
the second circuit unit comprises a second PMOS transistor and a second NMOS transistor, and a drain of the second PMOS transistor, a drain of the second NMOS transistor and the second output end of the CCA circuit are connected; and
a gate voltage of the first PMOS transistor is the same as a gate voltage of the second PMOS transistor, and a gate voltage of the first NMOS transistor is the same as a gate voltage of the second NMOS transistor.

11. The touch control chip according to claim 10, wherein a ratio between the first current and the second current is obtained by setting a ratio between a width/length of the first PMOS transistor and the first NMOS transistor and a width/length of the second PMOS transistor and the second NMOS transistor.

12. The touch control chip according to claim 10, wherein a ratio between the first current and the second current is obtained by setting a ratio between the number of the first circuit unit and the number of the second circuit unit included in the CCA circuit.

13. The touch control chip according to claim 9, a ratio between the first current and the second current output by the CCA circuit is adjustable, and the cancellation capacitance is an adjustable capacitance, wherein the output of the PGA circuit is 0 when the capacitance to be measured is the initial value by adjusting the ratio between the first current and the second current and/or the cancellation capacitance.

14. The touch control chip according to claim 9, wherein the ratio between the first current and the second current is between 5:1 and 10:1.

15. The touch control chip according to claim 9, wherein the PGA circuit comprises a differential amplifier, and a feedback capacitance and a feedback resistance connected cross an input end and an output end of the differential amplifier.

16. The touch control chip according to claim 9, wherein the coding voltage is a square wave signal or a sinusoidal signal.

17. An electronic device, comprising:
a touch screen; and
the touch control chip according to claim 9.

* * * * *